United States Patent
Andoh

(10) Patent No.: US 6,774,617 B2
(45) Date of Patent: Aug. 10, 2004

(54) PEAK DETECTOR FOR DETECTING A PEAK SIGNAL

(75) Inventor: Hajime Andoh, Shiga (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/991,848

(22) Filed: Nov. 21, 2001

(65) Prior Publication Data

US 2002/0075041 A1 Jun. 20, 2002

Related U.S. Application Data

(60) Provisional application No. 60/253,507, filed on Nov. 28, 2000.

(51) Int. Cl.$^7$ .......................... G01R 19/04; H03K 17/00
(52) U.S. Cl. ...................................... 324/103 P; 327/94
(58) Field of Search ............................ 324/103 P, 102; 327/90–97

(56) References Cited

U.S. PATENT DOCUMENTS

| | | | | |
|---|---|---|---|---|
| 5,594,384 A | * | 1/1997 | Carroll et al. | 327/91 |
| 5,986,481 A | * | 11/1999 | Kaminishi | 327/96 |
| 5,995,166 A | * | 11/1999 | Kawano | 348/691 |
| 2004/0027174 A1 | * | 2/2004 | Ballentin et al. | 327/94 |

* cited by examiner

*Primary Examiner*—Kamand Cuneo
*Assistant Examiner*—Jermele Hollington
(74) *Attorney, Agent, or Firm*—W. Daniel Swayze, Jr.; W. James Brady; Frederick J. Telecky, Jr.

(57) ABSTRACT

A peak detector for detecting a peak signal includes an input circuit to input an input signal, a track and hold circuit to hold the input signal and to output the peak signal, a comparator to compare the input signal and the peak signal to generate a clock signal, and said track and hold circuit to output the peak signal in accordance with the clock signal.

2 Claims, 1 Drawing Sheet

PEAK DETECTOR FOR DETECTING A PEAK SIGNAL

This application claims priority under 35 USC §119(e)(1) of provisional application Serial No. 60/253,507, filed Nov. 28, 2000.

FIELD OF THE INVENTION

The present invention relates generally to peak detectors and more particularly to a peak detector for a small input signal.

BACKGROUND OF THE INVENTION

In disks, such as DVD or DVD-RAM, information is recorded in sector units. A sector includes a header information area having a physical identification data and a user data area. The header information area is typically divided into a peak header area and a bottom header area, and user data is divided into land area and groove area. In DVD-RAM disks, a track is formed spirally, and the track is shifted laterally at a predetermined reference point. The reference point usually becomes a starting point of the first sector.

In DVD applications, peak detectors are used. An AC peak detector is non-linear circuit used to obtain a steady state amplitude at a level of the peak amplitude of the input AC signal. The input AC signal need not be a uniform sinusoidal or an infinite sum of sinusoidals such as in a square wave signal, but any signal with approximately complimentary positive and negative voltage peaks, such as communication data signal can be an AC signal.

A number of peak detector designs are known, however, each design has shortcomings which limit the range of operability and performance within that range. In particular, there is a need for peak detectors which detect peaks with amplitudes as low as 50 or even 20 millivolts. The known designs do not demonstrate acceptable performance at such levels and more particularly has dead zones where a new peak is not recorded.

FIG. 1 illustrates a peak hold circuit. An input signal is input to the base of transistor 100. A current flows from collector to base of collector 100. If the current exceeds the current flowing in the constant current source 102, current flows through capacitor 104 and charges up capacitor 104. The voltage on capacitor 104 is the peak hold voltage.

FIG. 2 illustrates a typical input voltage. As discussed before, the input signal need not be sinusoidal. FIGS. 2 and 3 illustrates wave forms including the held voltage at the top of the wave form.

FIG. 3 illustrates the relationship between the input amplitude and the peak hold voltage and the input amplitude. As can be very clearly seen, this circuit introduces a large amount of dead region that is not representative of the peak voltage.

SUMMARY OF THE INVENTION

The present invention provides a peak hold circuit that includes a track and hold circuit and a comparator circuit which provide improved peak detection with minimal dead regions.

DETAILED DESCRIPTION OF THE PRESENT INVENTION

Figure 1:
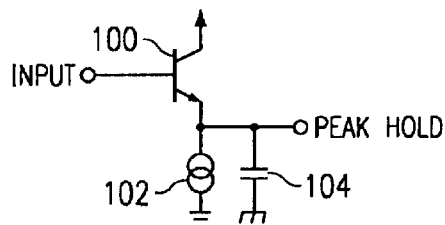
FIG. 1 illustrates a peak hold circuit.
Figure 2:
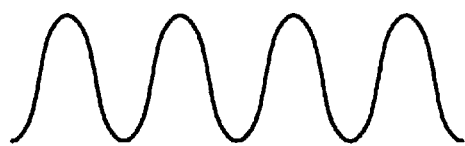
FIG. 2 illustrates an input signal.
Figure 3:
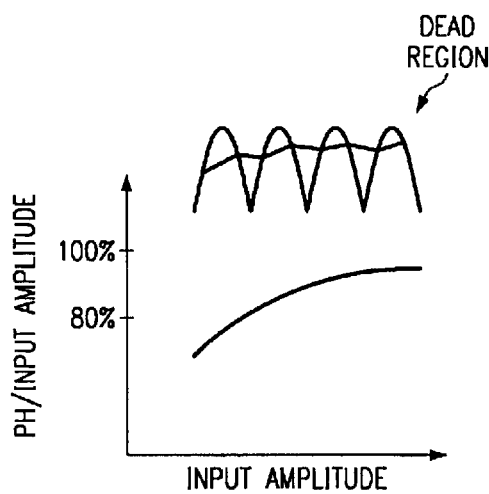
FIG. 3 illustrates a wave form showing the relationship between peak hold voltage/input amplitude and input amplitude.
Figure 4:
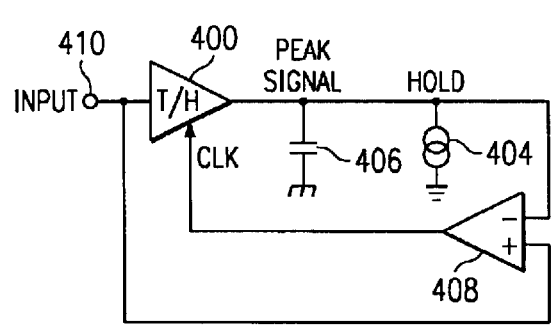
FIG. 4 illustrates a peak hold circuit of the present invention.

Turning to FIG. 4, an input signal which may be the input signal of FIG. 2 is input to a track and hold circuit 400 through input terminal 410. The hold circuit tracks the input signal and holds it and outputs an output signal in accordance with a clock signal which is input. The output of the track and hold circuit 400 is input to capacitor 406, and capacitor 406 is connected to the track and hold circuit 400 and connected to ground. Connected in parallel to the capacitor 406 is constant current source 404. The constant current source 404 is connected to the track and hold circuit 400 and connected in parallel to the capacitor 406. The capacitor 406 forms a voltage from the charge resulting from the output of the track and hold circuit 400 and produces a peak hold voltage as an output voltage. The output of the track and hold circuit 400 is connected to the minus input of comparator 408. Additionally, the input signal is connected to the plus input of comparator 408. The output of comparator 408 is a series of pulses and is input to the clock input of the track and hold circuit 400.

Figure 5:
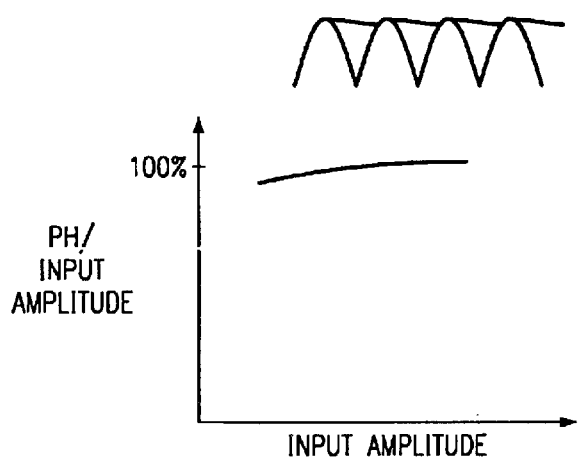
FIG. 5 illustrates a wave form showing the relationship between peak hold voltage/input amplitude and input amplitude of the present invention.

In operation, the input signal is input to the track and hold circuit 400 as well as the comparator 408. The output from the track and hold circuit which corresponds to the current or old peak old voltage is input to the comparator, and a comparison is made within comparator 408 to compare the new peak with the old peak voltage. The comparator 408 produces an output pulse whenever the input signal is greater than the current or old peak voltage. This output from the comparator 408 is a series of pulses which is input to the clock input of the track and hold circuit 400. Thus, the track and hold circuit outputs the input voltage in accordance with the output of the comparator circuit 404. The peak hold voltage is formed on capacitor 406 and is held. During non-clock pulses, the voltage of capacitor 406 is discharged through current source 404. The present invention provides a high peak hold voltage for input amplitude as illustrated in FIG. 5 with a small amount of dead region.

What is claimed is:

1. A peak detector for detecting a peak signal, comprising:

an input circuit to input an input signal;

a track and hold circuit to hold said input signal and to output said peak signal;

a comparator to compare said input signal and said peak signal to generate a clock signal;

said track and hold circuit to output said peak signal in accordance with said clock signal.

2. A peak detector for detecting a peak signal as in claim 1, wherein said peak detector includes a capacitor to hold said peak signal.

* * * * *